United States Patent

Narizuka et al.

[11] Patent Number: 6,124,553
[45] Date of Patent: Sep. 26, 2000

[54] MULTILAYER WIRING BOARD HAVING VENT HOLES AND METHOD OF MAKING

[75] Inventors: Yasunori Narizuka, Hiratsuka; Naoki Matsushima, Yokohama; Hidetaka Shigi, Kanagawa-ken; Haruhiko Matsuyama, Hiratsuka, all of Japan

[73] Assignee: Hitachi, Ltd., Tokyo, Japan

[21] Appl. No.: 08/262,270

[22] Filed: Jun. 20, 1994

[30] Foreign Application Priority Data

Jun. 12, 1993 [JP] Japan ................................. 5-305515
Jun. 18, 1993 [JP] Japan ................................. 5-147745

[51] Int. Cl.⁷ .................................................. H05K 1/16
[52] U.S. Cl. ................... 174/260; 174/52.4; 174/35 R
[58] Field of Search ............................... 174/35 R, 255, 174/261, 52.4, 260; 361/793, 795, 794, 792, 796, 756, 752, 800, 816, 818, 820; 29/830, 846, 829; 257/704

[56] References Cited

U.S. PATENT DOCUMENTS

| | | | |
|---|---|---|---|
| 4,320,438 | 3/1982 | Ibrahm et al. | 361/764 |
| 4,458,291 | 7/1984 | Yanagisawa et al. | 361/212 |
| 4,635,165 | 1/1987 | Okuaki | 361/684 |
| 4,736,521 | 4/1988 | Dohya | 29/830 |
| 4,811,082 | 3/1989 | Jacobs | 357/80 |
| 4,962,287 | 10/1990 | Oshima | 174/261 |
| 5,341,274 | 8/1994 | Nakatani et al. | 361/818 |
| 5,371,321 | 12/1994 | Hemzehdoost et al. | 174/52.4 |
| 5,389,738 | 2/1995 | Piosenka et al. | 174/52.4 |
| 5,491,301 | 2/1996 | Akiba et al. | 174/250 |
| 5,510,758 | 4/1996 | Fujita et al. | 333/247 |

*Primary Examiner*—Kristine Kincaid
*Assistant Examiner*—Kamand Cuneo
*Attorney, Agent, or Firm*—Antonelli, Terry, Stout & Kraus, LLP

[57] ABSTRACT

A multilayer wiring system for preventing the generation of fixing failure due to an organic residue, eliminating an increase in the number of processes and reducing an area necessary for bonding of the cap and its fabrication method. The multilayer wiring board includes at least one wiring layer made of a conductor, at least one insulating layer made of an organic matter and a board. The wiring layer and the insulating layer are alternately laminated on the board and a cap is provided for covering the insulating layer and the wiring layer. The wiring layer has a wiring pattern for forming a wiring and a frame pattern for surrounding the wiring pattern. This frame pattern includes vent holes. The insulating layer has a shield structure made of an inorganic matter around the outer peripheral portion thereof and/or in the interior thereof. The shield structure is formed of the frame patterns continuously connected to each other and the cap is joined to an uppermost layer of the shield structure.

4 Claims, 13 Drawing Sheets

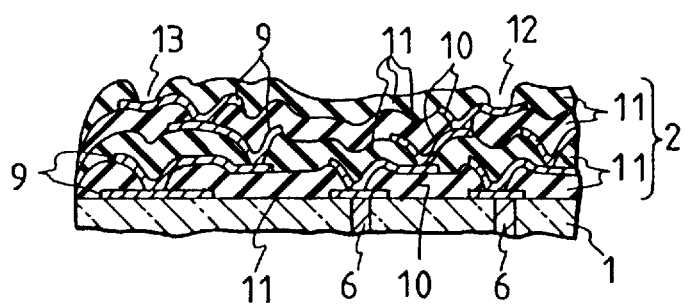
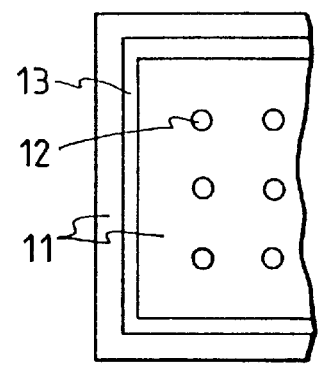
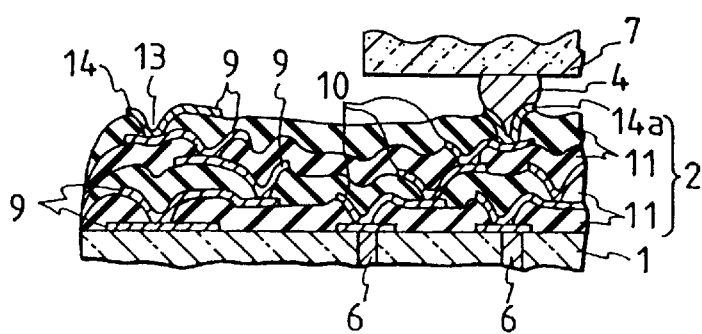
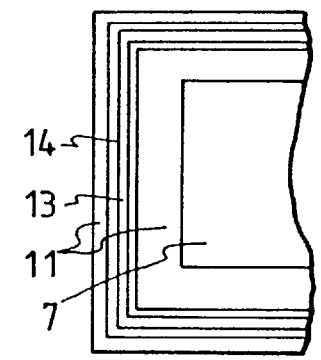
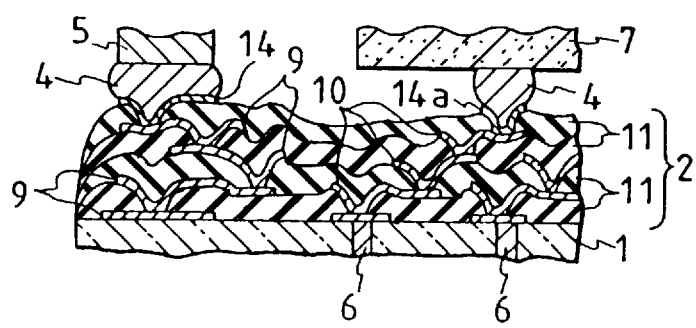
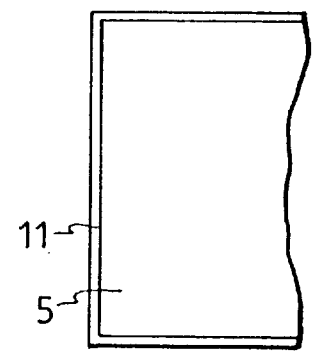

MULTILAYER WIRING BOARD HAVING VENT HOLES AND METHOD OF MAKING

BACKGROUND OF THE INVENTION

The present invention relates to a wiring board and a fabrication method for a wiring board, and more particularly to a multilayer wiring board and fabrication method therefore suitable for electronic devices in which large scale circuits are incorporated with high density, for example electronic devices necessary for processing electric signals at high speed which includes electronic computers and electronic exchangers, wherein the multilayer wiring board is formed with a shield structure for preventing the permeation of gas or moisture.

Recently developed electronic devices greatly depend on a mounting technique for incorporating a large number of large scale integrated circuits (LSIs) in a limited space. Along with this trend, thin film multilayer wiring layers using insulating layers made of a material having low dielectric, such as organic resin, have been formed on a printed board or thick film ceramic board conventionally used to mount LSIs. Moreover, to further enhance the mounting density, there have been strong demands to make fine the wiring structure and to make multiple the wiring layers. As a consequence, it has become important to ensure the reliability of the wiring.

A fine wiring is susceptible to wiring failure called electric corrosion due to the carrying of current in the presence of moisture. The reason for this is that, the potential gradient between wirings becomes larger as the distance between the wirings is shortened, so that metal forming each wiring is ionized due to the presence of the electric field and water. This ionized metal is susceptible to elution, and the ions thus eluted is moved by the attractive force of the electric field and is precipitated causing defects in the wiring and adhesion of the metal to the wiring. Thus, breaks in the wiring and short circuits occur between the wirings.

To prevent the elution of the metal ions described above, wirings have been generally sealed to prevent the permeation of water. A method of sealing the whole wiring board by resin has been adopted in the case where air-tightness is not strictly required.

However, currently there has been the trend to make fine the wiring and to enhance the density of the wiring, requiring the board to be cooled for suppressing the heat generated by the wiring and electronic devices mounted on the board. The air-tight sealing by resin makes it impossible to sufficiently cool the board. Moreover, when LSIs and the surface of the wiring board on which the LSIs are mounted are dipped in an inert gas such as N2 or He, or in an inert insulating liquid such as freon for cooling the LSIs, the air-tight sealing to a level higher than what is possible with resin is required for preventing the permeation of gas or liquid.

Moreover, due to the fineness of the wiring in recent years, even water in trace amounts have caused breakages and shortages of the wiring. As a result it is now standard for the wiring board to prevent the permeation of moisture to a level higher than that possible when the sealing by resin allows.

Thus, currently fine wirings have been sealed not using the air-tight sealing of resin but using an air-tight sealing structure called hermetic seal. This structure is to perform the sealing using a cap made of ceramic or metal.

The cap is occasionally joined on a board using adhesive, but for ensuring perfect air-tightness, it may be preferable to join the cap using brazing filler metal (solder). Conventionally, when the above cap is joined on the board using the brazing filler metal, the board is generally a ceramic board. Namely, a resin made board or resin made insulating layer is not used because the melting point of the brazing filer metal is high compared with the organic material and also the permeation of water content through the board must be prevented.

The problem of heat-resistance can be solved by the adoption of a polyimide resin which can withstand high temperatures near 400° C. However, the polyimide resin is high in moisture permeability. Currently it is not known of any other practical resin having excellent air-tightness to perfectly prevent the permeation of moisture. Accordingly, the surface of the resin made board or the organic insulating layer can not be directly sealed.

Thus, in the conventional hermetic seal structure, the outer peripheral portion of the board must be sealed to be air-tight. In this regard, the conventional hermetic structure has a disadvantage in requiring a large area on the board. To cope with this disadvantage, Japanese Patent Laid-open No. 63-175450 has disclosed a multilayer wiring board sealed by the improved hermetic seal structure shown in FIG. 8.

Japanese Patent Laid-open No. 63-175450 as illustrated in FIG. 8 provides an air-tight seal structure including a ceramic wiring board 1, multiple wiring layers 2 having organic insulating layers formed on the ceramic wiring board 1, and a semiconductor chip 7 mounted on the multiple wiring layers 2 through a solder bump 8, wherein the air-tight sealing is performed using a cap 5. In this method, the above multiple wiring layers 2 are sealed air-tight by the steps of partially removing the multiple wiring layers 2 formed on the surface of the ceramic board 1, forming a metal layer 3 on an exposed surface 1a of the ceramic board and on an exposed surface 2a of the multiple wiring layers, and joining the sealing cap 5 to the metal layer 3 with a brazing filler material 4.

However, the above sealing method has a disadvantage that the organic insulating layers on the surface 1a of the ceramic board and on the surface 2a of the multiple wiring layers are not always perfectly removed thereby causing bonding failure due to the residue of the organic matter. Moreover, the above method requires the steps of removing the organic insulating and forming a metal layer on the areas removed. Thus, the above method increases the number of steps required for fabrication. Additionally, for brazing the cap 5, a metal layer having a width of 5 to 6 mm is required, thereby enlarging the loss in area. This loss in area further constrains the available area for the fine integration of circuits.

SUMMARY OF THE INVENTION

An object of the present invention is to provide a multilayer wiring board and fabrication method therefore suitable for electronic devices in which large scale circuits are incorporated with high density and wherein the multilayer wiring board is formed with a shield structure for preventing the permeation of gas or moisture.

Another object of the present invention is to provide a multilayer wiring board and fabrication method therefore wherein a maximum amount of area is allowed for the electronic devices in which large scale circuits are incorporated with high density.

According to the present invention, there is provided a multilayer wiring board including at least one wiring layer made of a conductor, at least one insulating layer made of an organic matter, and a board. The wiring layer and the insulating layer are alternately laminated on the board and a cap is provided for covering the insulating layer and the wiring layer. The wiring layer has a wiring pattern for forming a wiring, and a frame pattern for surrounding the wiring pattern. The insulating layer has a shield structure made of an inorganic matter around the outer peripheral portion thereof and/or in the interior thereof. The shield structure is formed of the frame patterns of each of the layers continuously interconnected to the other frame patterns, and the cap is joined to an upper most layer of the shield structure.

Moreover, according to the present invention, there is provided a fabrication method for a multilayer wiring board including the steps of forming a wiring pattern and frame pattern on a thick film wiring board having a thick film wiring pattern, wherein the wiring pattern and the frame pattern formed on the thick film wiring board is connected to the thick film wiring pattern and the frame pattern formed on the thick film wiring board surrounds the wiring pattern formed on the thick film wiring board, forming an insulating layer made of an organic matter on a previously formed wiring pattern and frame pattern, forming through holes in the insulating layer over the previously formed wiring pattern and a continuous channel or groove in the insulating layer over the previously formed frame pattern by removing portions of the insulating layer, forming another wiring pattern and frame pattern on the insulating layer around the through holes and the continuous channel or groove to connect the wiring pattern and frame pattern to the previously formed wiring pattern and frame pattern, repeating the forming steps a specified number of times to form a thin film wiring board on the thick film wiring board, connecting the terminals of an electronic device to an uppermost wiring pattern of the thin film wiring board and connecting a cap to an uppermost frame pattern of the thin film wiring board. The cap shields the wiring layer and the insulating layer from the atmosphere on the frame pattern of the wiring layer formed at the uppermost layer.

The connections formed between the above-described frame pattern of each of the layers forms a wall in a length capable of substantially shielding the board from the permeation of a gas or moisture to the internal area of the sealed cap or into the thin film wiring board material.

An organic matter such as polyimide has sufficient characteristics as an insulating layer of a wiring board when considering heat resistance and mechanical strength, but is disadvantageous in moisture permeability. Accordingly, when forming the wiring board using an organic matter, the organic matter must be shielded from water and gas and thus should not be in contact with the atmosphere.

The permeation of water and gas through the front surface of a board (that is, the side of the board on which an insulating layer made of the above organic matter is formed) can be prevented using a metal or ceramic cap. Moreover, the permeation from the back surface (that is, the said of the board on which the insulating layer made of the above-organic matter is not formed) can be prevented using a ceramic board or by the provision of an inorganic layer (including a metal layer) such as a shield structure in the wiring board as described above.

In the present invention, by sequentially connecting the frame patterns formed in the fabrication of the wiring board from the lowermost layer to the uppermost layer, a shield structure made of a metal wall is formed in the multiple organic insulating layers, which can prevent the permeation of water and gas.

The shield structure in the present invention also has an electrostatic shield effect. Moreover, it is made of metal, and can be used as an earth line.

The shield structure of the present invention is desired to be perfectly continuous and to be separated between the interior and the exterior of the wiring board. However, if the shield structure is partially discontinuous, it has a partial shielding effect.

BRIEF DESCRIPTION OF THE DRAWINGS

The improvements of the present invention and the advantages resulting therefrom will become apparent upon reading the following description of the preferred embodiments in light of the drawings in which like parts are designated with like numerals and in which:

FIGS. 2A–F' are plan and sectional views for explaining a fabrication method for a multilayer wiring board according to the present invention;

DETAILED DESCRIPTION OF THE PREFERRED EMBODIMENTS

Figure 9:
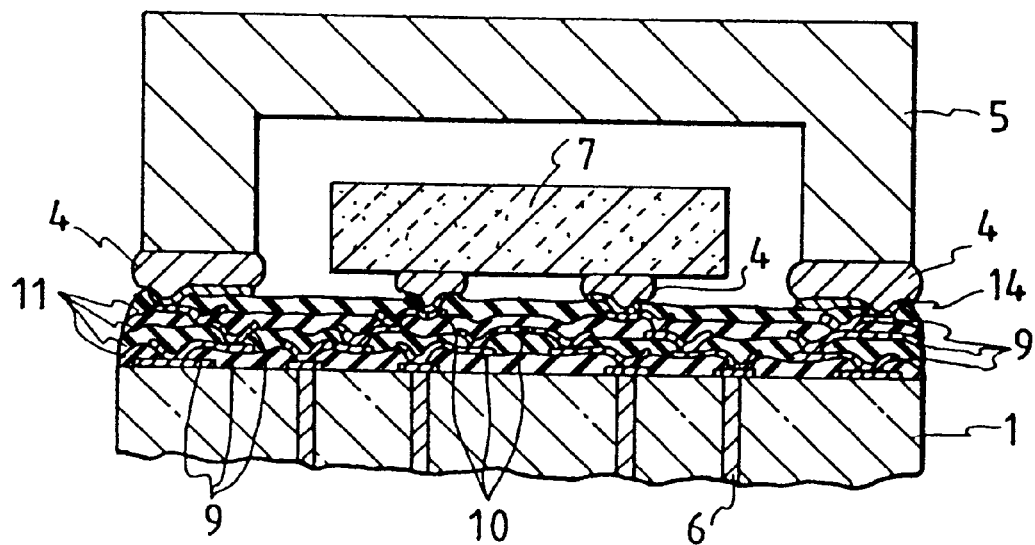
FIG. 9 is a sectional view of a multilayer wiring board according to the present invention.

FIGS. 2A–2F' shows a fabrication process for a multilayer wiring board of the present invention. FIG. 9 is a sectional view of a multilayer wiring board fabricated according to the present invention. In the multilayer wiring board a ceramic board 1 is provided including conductors 6. Insulating layers 11 made of resin such as polyimide, and wiring layers each having a wiring 10 and a frame pattern 9 surrounding the wiring 10 which are both made of metal, are alternately laminated on the ceramic board. Uppermost portions 14 and 14a of the wiring layers are made of a metal for brazing. Moreover, the uppermost wiring layer has a structure that a semiconductor chip 7 or the like is connected thereto by a brazing filler metal 4. The upper, lower and intermediate wiring layers are connected to each other via through-holes 12. Moreover, a cap 5 for sealing the multiple wiring layers and the semiconductor chip 7 is mounted on the uppermost frame pattern 9 through the brazing filler metal 4. The steps of the multilayer wiring board fabrication method are as follows.

Figure 2A:
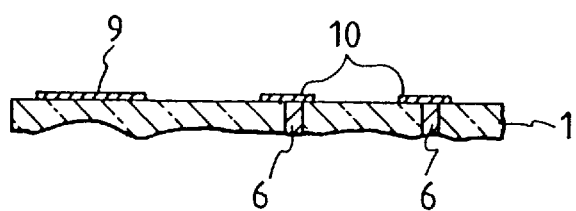
Figure 2A:
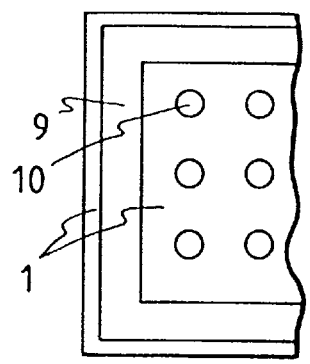

As illustrated in FIGS. 2A and 2A' a metal layer, which is made of either of Al, Al—Si, Al—Si—Cu, Cu, Ni, W, Mo, or which is formed of a lamination of either of the above metals and other material, is formed on a ceramic board 1 including conductors 6 formed by a thick film formation technique. In this embodiment, the metal layer is made of Al. This metal layer is subjected to photoetching, to form a specified wiring pattern 10, and to simultaneously form a frame pattern 9 having the shape of a self-closing line with a width of about 50 μm for surrounding the wiring pattern 10. In this embodiment, since the frame pattern 9 and the wiring pattern 10 are formed in the same process, they are made of the same metal (Al). However, the frame pattern 9 may be made of a metal different from that of the wiring pattern 10. In this case, the number of the steps must be increased.

The frame pattern 9 is connected to a frame pattern 9 at another layer formed later, to surround the wiring, pattern thereby forming a barrier for preventing the permeation of water or the like into a polyimide layer. Accordingly, the thicker the frame pattern 9 the higher the achievement of air-tightness. It is preferably formed to a thickness of 1 μm or more. The thickness of 5 μm or more is sufficient to secure the air-tightness. The wiring is usually formed to such thickness to prevent problems in forming the frame pattern 9 and the wiring pattern 10 in the same film formation process.

Figure 2B:
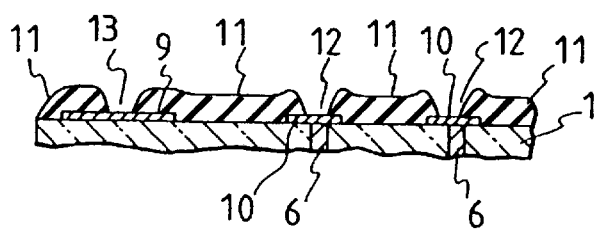
Figure 2B:
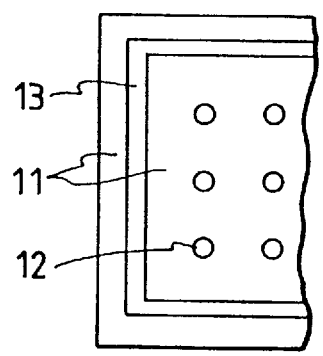

As illustrated in FIGS. 2B and 2B' on the ceramic board 1 on which the metal patterns 9 and 10 are formed as described above, a varnish mainly containing a polyimide precursor is coated and then baked, to form a polyimide insulating layer 11 having a thickness of several μm. In this embodiment, the photosensitive resin under the trade name "PIQ" sold by HITACHI CHEMICAL is used as the polyimide precursor. After that, through-holes 12 each having a width of about 50 μm (as the through-holes for the polyimide insulating layer 1) are formed over the wiring pattern 10 and at the same time, a groove or channel 13 passing through the polyimide insulating layer 11 and having a width of about 30 μm is formed over the frame pattern 9. The above groove 13 is shaped in a self-closing line which surrounds the wiring pattern 10. A part or all of the frame pattern 9 are exposed by the groove or channel 13. Preferably, the groove 13 is formed to a length of 20 μm or more.

Figure 2C:
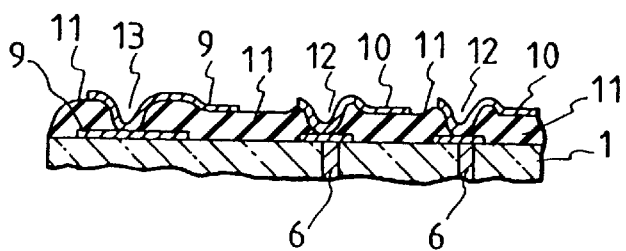
Figure 2C:
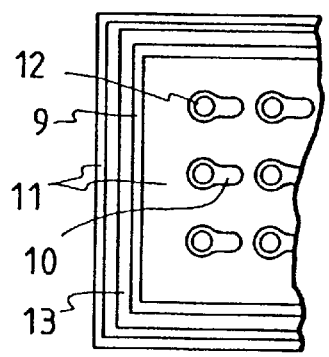

As illustrated in FIGS. 2C and 2C' a thin film wiring pattern 10 is further formed on the polyimide insulating layer 11 and the through-holes 12, and at the same time, a frame pattern 9 is formed on the groove 13 to cover the side surfaces of the groove 13. Thus, the wiring pattern 10 and the frame pattern 9 are connected to the wiring pattern 10 and the frame pattern 9 of the previous layer.

As illustrated in FIGS. 2D and 2D' the above steps illustrated in FIGS. 2B and 2B' as well as 2C and 2C' are repeated a specified number of times, as a result of which a specified number of wiring layers 2 are obtained. Just as the wiring patterns 10 between the respective layers are connected to each other through the metal films in the through-holes 12, the frame patterns 9 between all the layers are connected to each other through the metal films in the grooves 13. since the frame patterns 9 are connected to each other between all of the layers they perform the role of preventing the permeation of water or gas by providing a barrier or wall in the wiring board.

As illustrated in FIGS. 2E and 2E' metal patterns 14a and 14 made of N for brazing which serves to connect the LSI chip to the wiring board are respectively formed on the through-hole 12 and the groove 13 at the uppermost layer in such a manner as to cover the side surfaces of the through-hole 12 and the groove 13. The LSI chip 7 is mounted by a brazing filler metal 4 to the metal patterns 14a. A metal such as Zr, Ti, Ni, Cu, Au may be used as the above metal layer for brazing.

As illustrated in FIGS. 2F and F', a cap 5 is covered on the multilayer wiring board mounting the LSI chip 7, and it is attached to metal pattern 14 formed on the groove 13 by the brazing filler metal 4 such as Sn—Pb. The multilayer wiring board is thus obtained. In this embodiment the cap is used for sealing, however, it may be substituted by a mold structure. In this case, the surface of the mold must be treated in such a manner to maintain air-tightness.

The attaching of the above cap 5 is performed as follows. First, the board is cleaned and dried. After drying a flux is coated in the atmosphere of an inert gas such as nitrogen and the brazing filler metal 4 is placed on the metal pattern 14 connected to the frame pattern 9. The cap 5 is then mounted on the metal pattern 14 and is attached thereto by heating in a reflow furnace. After cooling the flux is cleaned.

Figure 3:
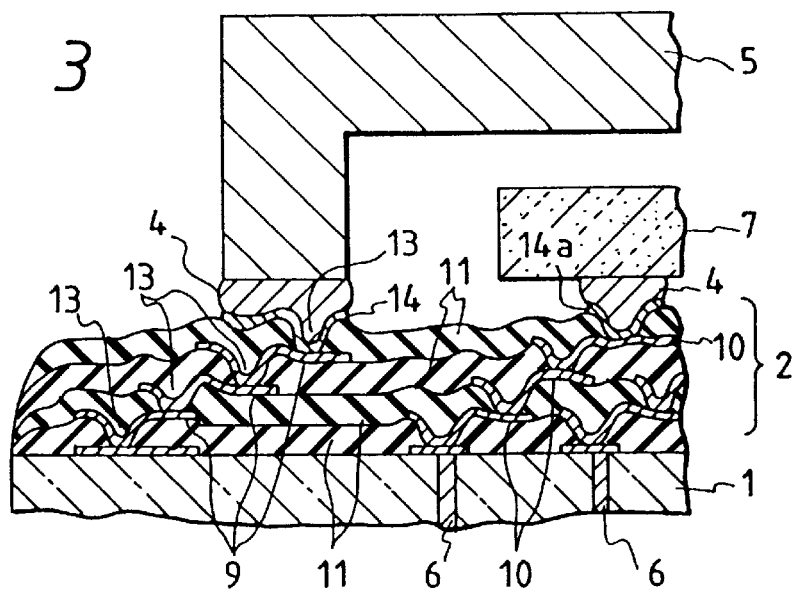
FIG. 3 is a sectional view of a multilayer wiring board in which grooves are shifted from each other.

Additionally, in formation of the grooves 13, as illustrated in FIGS. 2A–2F', as shown in FIG. 3. it is desirable that a new groove 13 is formed to not be directly over the already formed groove 13. In this way the groove 13 at the upper layer is formed not to be overlapped over the groove 13 at the lower layer. By shifting the positions of the grooves 13 as described above, the insulating layer 11 is formed such that the recess thereof generated by the groove 13 at the lower layer can be suppressed to a minimum, which makes it easy for the film formation and the photoetching of the upper layer, thereby preventing the generation of failures.

Figure 4A:
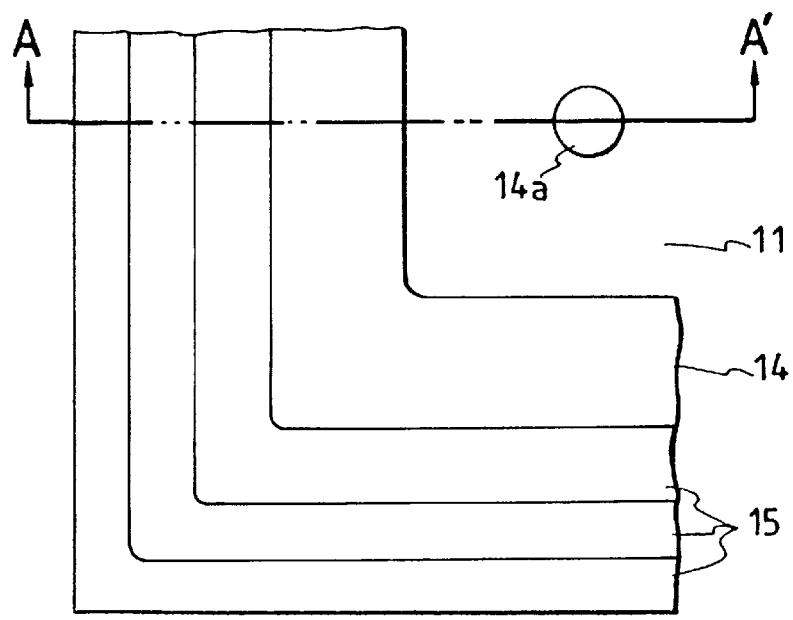
FIGS. 4A–B are plan and sectional views of a multilayer wiring board in which frame patterns are formed at the outer peripheral portions of insulating layers.
Figure 4B:
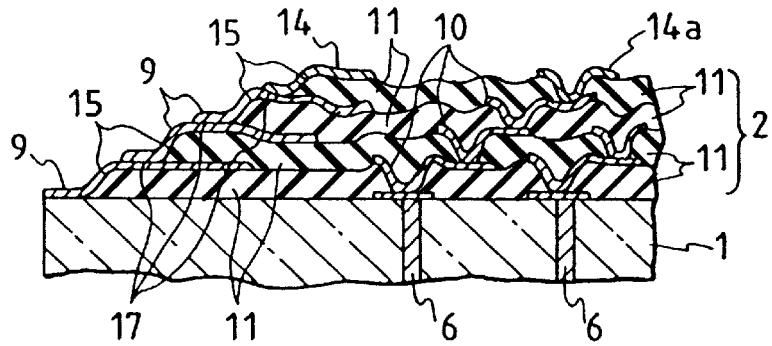

Another embodiment of the present invention is carried out in the same manner as described above, except that the groove 13 is not formed in the fabrication process. FIGS. 4A and 4B are views for explaining wiring layers formed in this embodiment. In this embodiment a frame pattern 9 is formed on an outer peripheral side surface 15 of a polyimide insulating layer 11. With this arrangement, the frame pattern at respective layers can be connected to each other without formation of the groove 13, to form a shield film (shield structure). FIG. 4A is a plane view of the wiring layers, and FIG. 4B is a sectional view taken along the line AA' of FIG. 4A.

In this embodiment, a multilayer wiring board is fabricated in the same fabrication process as described above and illustrated in FIGS. 2A–2F' except that a polyimide insulating layer 11 at the upper layer is formed to be smaller than a polyimide layer at the lower layer so as to leave a connection allowance area 17 of the frame pattern 9 at the lower layer. The formation of the groove 13 is eliminated by forming the frame pattern 9 at the upper layer on an outer peripheral portion 15 of the polyimide insulating layer 11 so as to be partially overlapped on the frame pattern 9 at the lower layer. In this embodiment, the metal shield structure is formed more easily than in the embodiment shown in FIGS. 2A–2F'.

FIGS. 11A–11F show another embodiment of the fabrication process for fabricating a multilayer wiring board of the present invention. In this embodiment, each groove 13 is filled with an inorganic matter and the upper and lower frame patterns are connected to each other through the organic matter. In this regard, this embodiment is different from the embodiment illustrated in FIGS. 2A–2F' in which the upper and lower frame patterns are connected to each other through the groove with the wall surfaces running along the upper frame pattern.

Figure 11A:
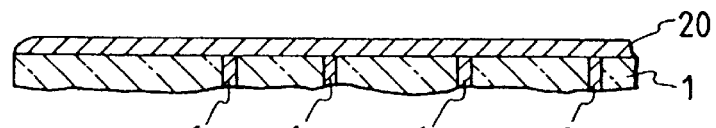
FIGS. 11A–F are views for explaining a fabrication method of a multilayer wiring board according to the present invention.

As shown in FIG. 11A on a ceramic board 1 having conductors 6 formed by a thick film formation technique, a metal layer 20 composed of a three-layer structure of Cr/Cu/Cr or Ti/Cu/Cr in this order from the lower layer is formed by sputtering or vapor deposition. In this embodiment, the metal layer 20 composed of the three-layer structure of Cr/Cu/Cr is formed.

Figure 11B:
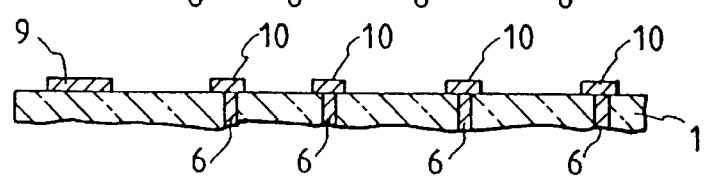

To form a specified wiring pattern 10 and a metal pattern (frame patter) 9 shaped in a self-closing line along the sides of the board, the metal layer 20 is formed by patterning of photoresist and is sequentially etched from the upper side. Thus, as shown in FIG. 11B, along with the formation of the wiring, the metal frame pattern 9 with a width of 10 $\mu$m to 10 mm which is shaped in the self-closing line along the sides (periphery) of the board. Since the frame pattern 9 and the wiring pattern 10 are simultaneously formed of the same material in the same process, the number of steps is not increased. Moreover, the thicker metal layer 20 can cover sufficiently the fine irregularities on the surface of the board, to thus achieve the higher air-tightness. Preferably, the thickness of the metal layer 20 is 1 $\mu$m or more. The thickness of 5 $\mu$m or more is sufficient to secure the air-tightness. The wiring is usually formed to a thickness such that there is no problem in forming the wiring 10 and the frame pattern 9 in the same process.

Figure 11C:
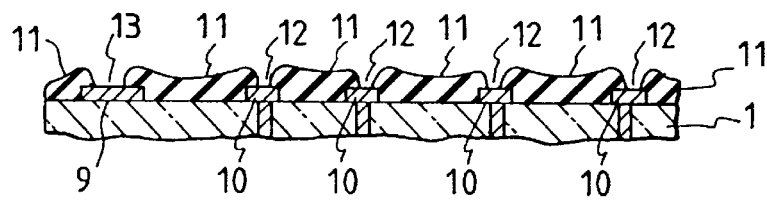

A varnish mainly containing a polyimide precursor is coated on the wiring pattern 10 and the frame pattern 9 thus formed, followed by baking to form an insulating interlayer 11 of polyimide which has a thickness of 5 $\mu$m or more even on the wiring is formed. As shown in FIG. 11C, through-holes 12 for electrically connecting the wiring 10 on the surface of the board 1 with the wiring 10 on the insulating layer 11 are formed by photoetching at the specified positions. At the same time, a groove or channel 13 is formed on the frame pattern 9 provided on the peripheral portion of the board such that it is overlapped over the frame pattern 9 of the lower layer. Thus, the groove 13 forms the self-closing line to surround the wiring pattern 10 over the frame pattern of the lower layer.

Figure 11D:
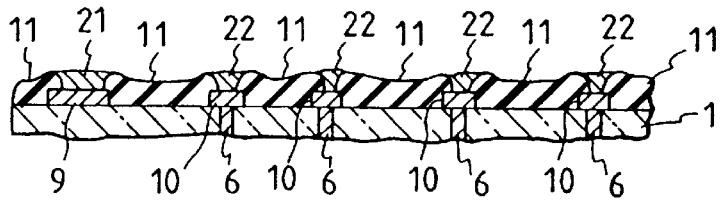

Thereafter, as shown in FIG. 11D, by etching the Cr layer constituting the uppermost layer of each of the metal layers 9 and 10 having the three-layer structure which expose the bottoms of the through-holes 12 and the groove 13, the Cu layer being the second layer of each of the metal layers 9 and 10 is exposed. The board is then dipped in an electroless plating solution of Cu to grow a Cu film in the through-holes 12 and the groove 13, thereby embedding the through-holes 12 with a Cu film 22 and also the groove 13 with a Cu film 12. At this time, by adjustment of the dipping time in the plating solution, the surfaces of the Cu films 21 and 22 grown by the plating can be made to have the same height as that of the surface of the insulating interlayer 11. The metal grown by the plating is not limited to Cu, and any metal capable of being grown to be thick by plating, such as Ni, may be used. Since the groove 13 is desired to be perfectly embedded with the Cu film 21, the width thereof is preferably narrower than that of the frame pattern 9 under consideration of the positioning accuracy upon patterning, while being 20 $\mu$m or more. Moreover, in the case that the side surfaces of the Cu film 21 formed by plating are overlapped on the side surfaces of the frame pattern 9, the total internal stresses of the frame pattern 9 and the Cu film 21 are applied to the surface of the board at the end of the frame pattern 9, so that the surface of the board 1 is often broken due to the stresses. Even in this viewpoint, the width of the Cu film 21 is desired to be narrower than that of the frame pattern 9.

In this embodiment the through-hole 12 and the groove 13 are filled with the same metal in the same process, however, the groove 13 may be filled with a different inorganic material (ceramic or the like). In this case, the number of steps are increased.

Figure 11E:
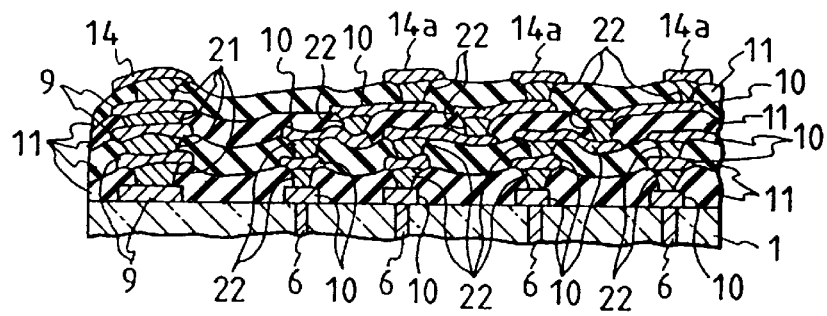

The above steps illustrated in FIGS. 11A–11D are repeated, so that the metal walls are sequentially formed in the insulating layers at the same time when the multiple wiring layers are formed. As shown in FIG. 11E, a metal layer for brazing which is used for soldering the LSI chip 7 is formed on the surface of the upper most layer. The above metal layer is made of either Zr, Ti, Ni, Cu and Au, or formed of a lamination of a metal layer for enhancing a bonding force such as Cr and one to three kinds of the above metal layers. The metal layer is subjected to photoetching to form metal layer patterns 14a for soldering the LSI chip 7 and a frame pattern 14 for joining a cap.

Figure 11F:
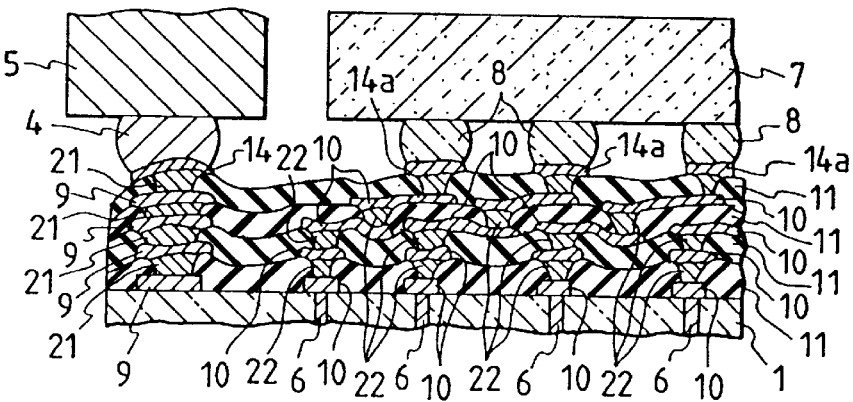

Finally, the LSI chip 7 is connected to the metal patterns 14a by a solder 8, and from the upper side of the LSI chip 7, a cap 5 is joined to the frame pattern 14 by a brazing filler metal 4 such as Sn—Pb, to thus air-tightly seal the LSI chip 7 as shown in FIG. 11F.

As the connection method for the LSI chip 7, there may be used a WB (Wire Bonding) method and a TAB (Tape Automated Bonding) method, other than the CCB (Control Collapse Bonding) method described above. However, the WB method and the TAB method have disadvantages that the connection is made larger and the connection process takes a long time. Moreover, the CCB method has an advantage that the connection of cap 5 can be performed along with the connection of the LSI chip 7.

According to this embodiment, even in the case that the thickness of the polyimide insulating layer 11 is thick (that is, the depth of the groove 13 is increased), the upper and lower frame patterns 9 can be connected to each other.

Figure 12A:
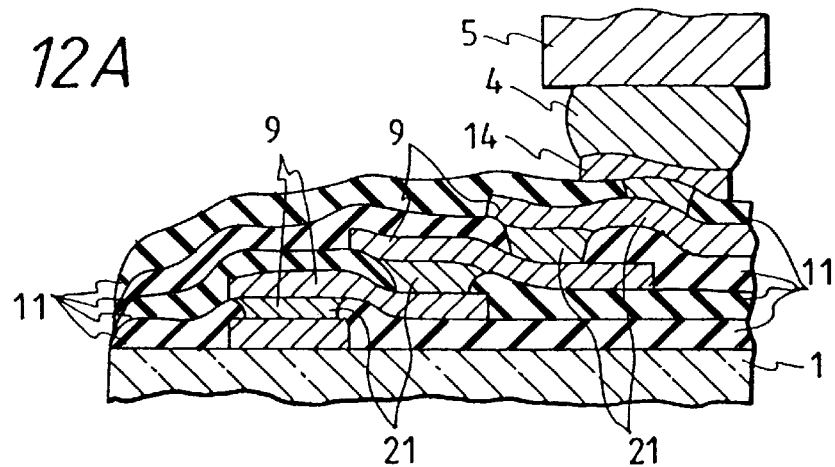
FIGS. 12A–B are sectional views of a multilayer wiring board in which grooves filled with metal are disposed so as not to be overlapped to each other.
Figure 12B:
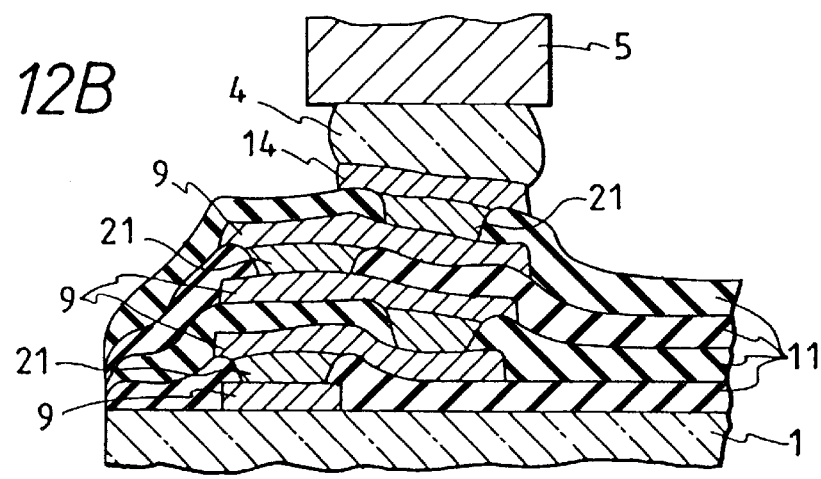

As shown in FIGS. 12A and 12B, in formation of a wiring board using the steps as in the embodiment illustrated in FIG. 11A–11F, the positions of the Cu films 21 formed on the frame patterns 9 by plating are different from each other between the lower and upper layers. Thus, the internal stress between the Cu film 21 and the frame pattern 9 for each layer is absorbed by a polyimide insulating interlayer 11, so that it is possible to make small the stresses applied to the board. This makes it possible to prevent the breakage of the board due to thermal fatigue or the like, and hence to obtain a wiring board having a high reliability. In the case shown in FIG. 12A, the frame metal pattern 9 and the Cu film 21 at the third layer or more can absorb the stresses because the polyimide insulating layer 11 is located at the same positions downwardly by three layers. Moreover, in FIG. 12B the area of the board necessary for forming the walls composed of a plurality of Cu films 21 and the frame patterns 9 is small, so that it is possible to achieve the miniaturization of the wiring board and to effectively utilize the surface of the board.

Figure 1A:
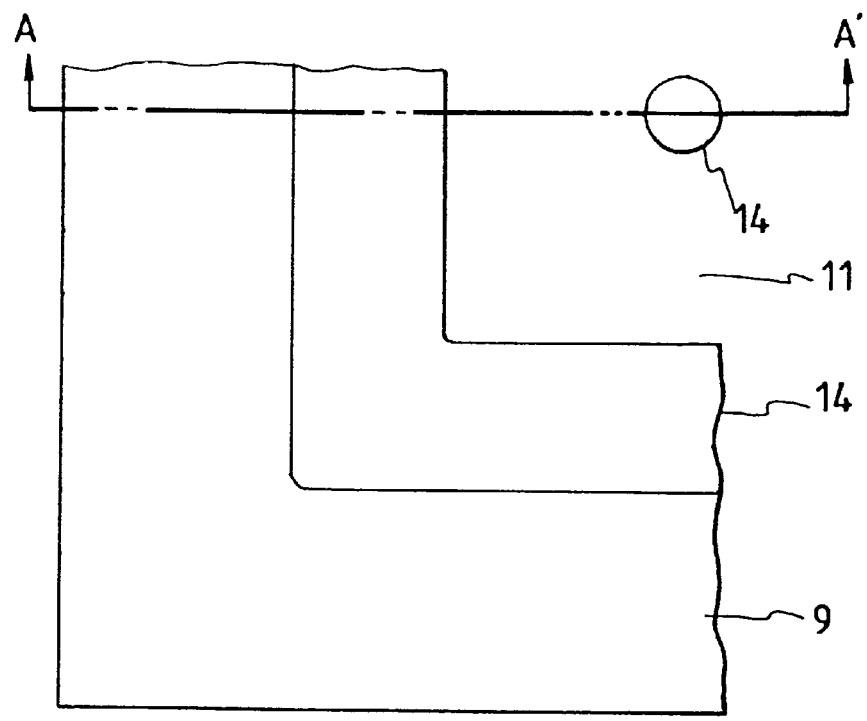
FIGS. 1A–B are plan and sectional views of a multilayer wiring board in which a frame-like pattern at the upper layer is formed to cover a frame-like pattern at the lower layer.
Figure 1B:
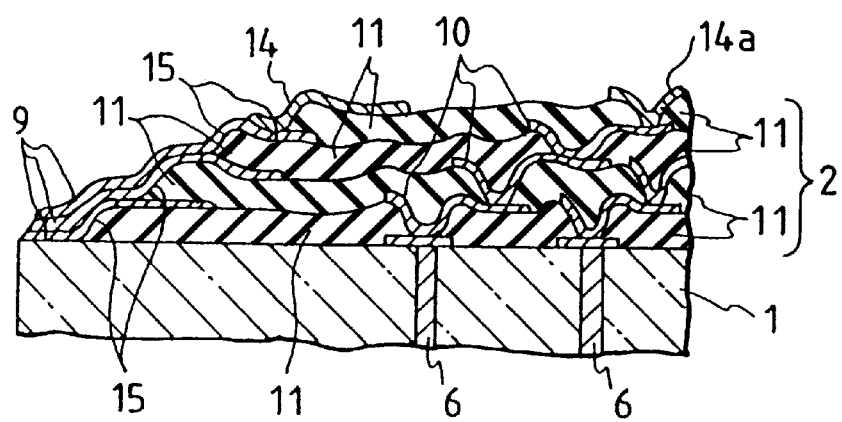

According to another embodiment illustrated in FIGS. 1A–1B, similar to the embodiment illustrated in FIGS. 4A–4B, the upper and lower frame patterns 9 are connected to each other by allowing a frame pattern 9 to run along an outer peripheral portion 15 of a polyimide layer 11 without formation of any groove 13, to form a shield structure. However, this embodiment is different from the embodiment illustrated in FIGS. 4A–4B in that the frame patterns 9 are formed such that the width of the frame pattern at the upper layer is made wide for covering the frame pattern 9 at the lower layer. FIG. 1A is a plan view of the wiring layer and FIG. 1B is a sectional view taken along the line AA' of FIG. 1A.

As shown in this embodiment, the frame patterns are overlapped at the lower wiring layer. This makes it possible to obtain the shield structure having a wall thicker than that in the embodiment illustrated in FIGS. 4A–4B and hence to increase the air-tightness.

Figure 5A:
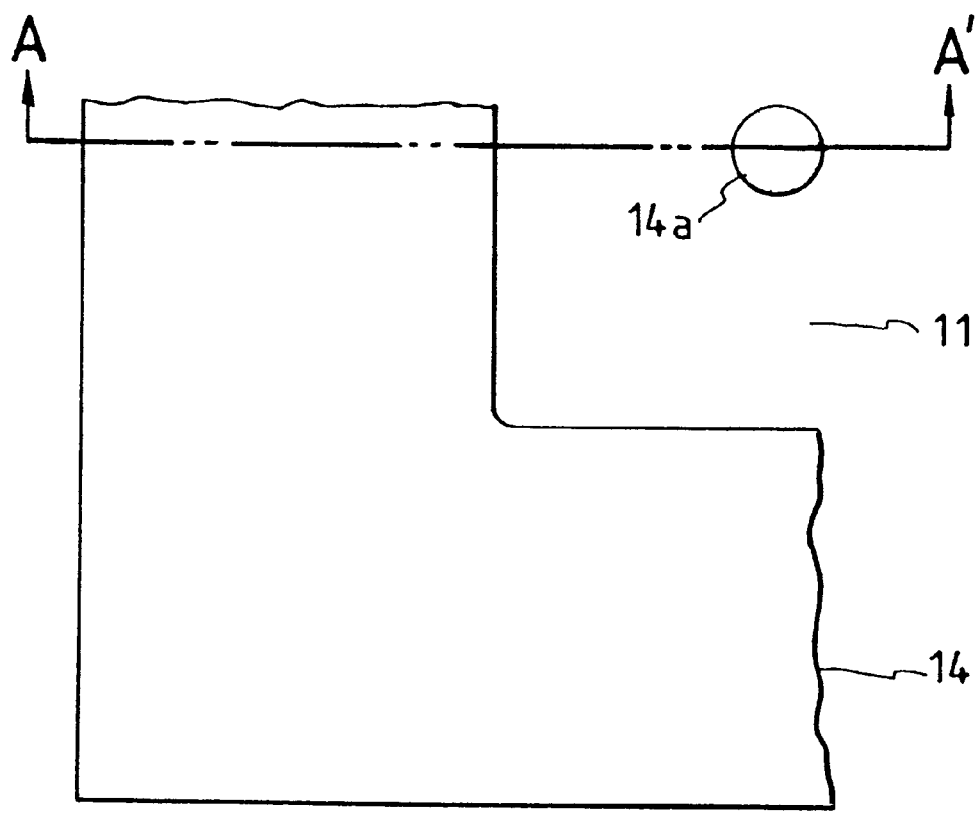
FIGS. 5A–B are plan and sectional views of a multilayer wiring board in which a frame pattern at the upper layer is formed to cover a frame pattern at the lower layer and a joining metal layer at the uppermost layer is formed to cover the frame pattern.
Figure 5B:
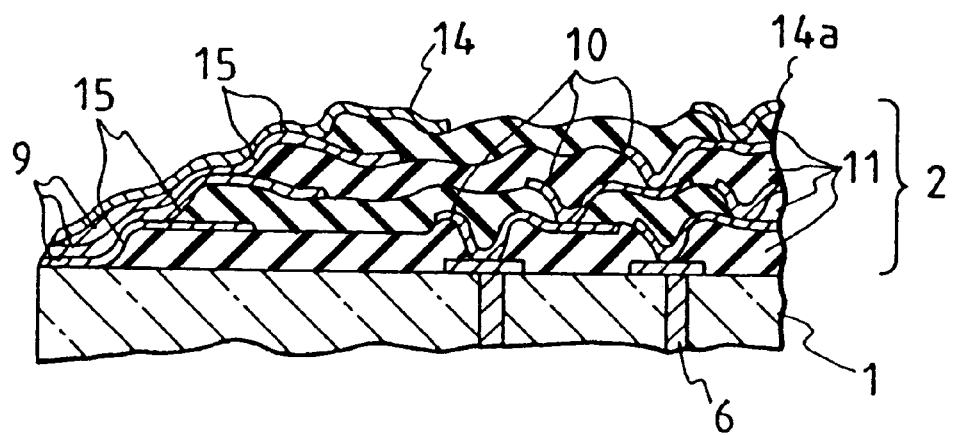

According to another embodiment illustrated in FIGS. 5A and 5B, similar to the embodiment illustrated in FIGS. 1A–1B an upper frame pattern 9 is made to run along an outer peripheral portion 15 of a polyimide layer, and in formation of the frame patterns 9, the frame pattern 9 at the upper layer is formed so as to cover the frame pattern 9 at the lower layer. However, this embodiment is different from the embodiment illustrated in FIGS. 1A–1B in that the connecting metal layer 14 is formed at the uppermost layer so as to further cover the frame pattern 9 at the uppermost layer. FIG. 5A is a plan view of the wiring layer and FIG. 5B is a sectional view taken along the line AA' of FIG. 5A.

According to this embodiment at the joining process the brazing filler metal 4 flows over the surface of the frame pattern 14 which covers the frame pattern 9 to be solidified, so that the air-tight sealing can be achieved even by the brazing filler metal 4, which makes it possible to more certainly maintain the air-tightness of the wiring layer.

Figure 6A:
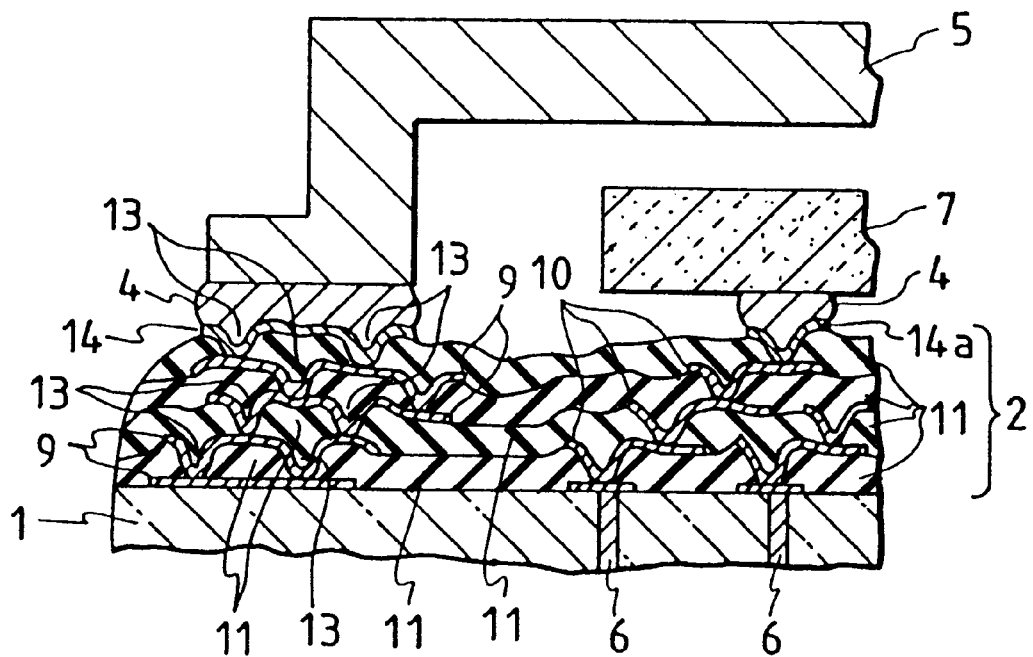
FIGS. 6A–B are sectional views of a multilayer wiring board in which grooves are double formed;.
Figure 6B:
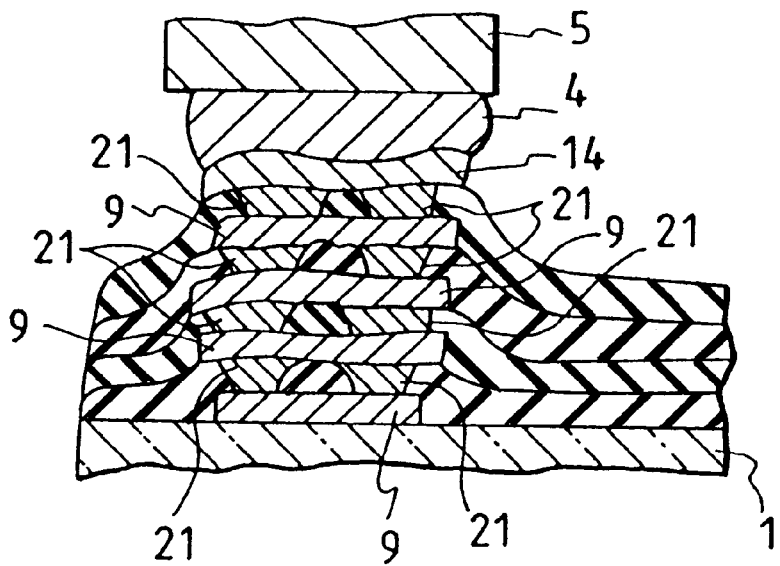

In another embodiment illustrated in FIGS. 6A and 6B, the shield structure of the multilayer wiring board is formed substantially in the same manner as in the embodiment illustrated in FIGS. 2A–2F', except that two grooves 13 are formed and a frame pattern 9 is formed to cover both the side surfaces of the two grooves 13. FIG. 6A is a sectional view of the multilayer wiring board formed by this embodiment. Additionally, in this embodiment the number of grooves 13 is two for each layer however, it may be three or more for each layer.

Moreover, according to the fabrication method described in the embodiment illustrated in FIGS. 11A–11F the multi-grooves 13 are formed in the insulating layers, which are filled with Cu films 21 formed by plating or the like, to thus fabricate the multilayer wiring board having the structure shown in FIG. 6B.

FIG. 9C illustrates a preferred cap crossection which reduces the amount of area needed for attaching the cap to the uppermost layer.

According to this embodiment, since the portions for connecting the upper and lower frame patterns 9 to each other are double formed it is possible to make multiple the shield structure for more certainly maintaining air-tightness.

Figure 7A:
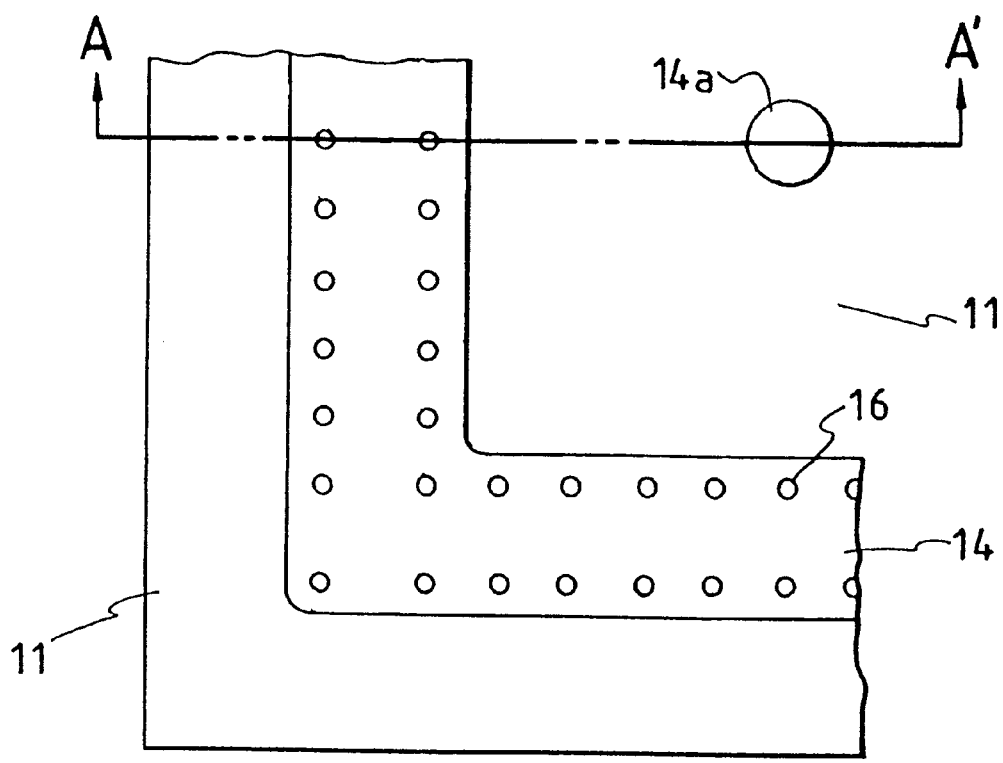
FIGS. 7A–B are plan and sectional views of a multilayer wiring board in which gas-vent holes are formed on the joining metal layer at the uppermost layer.
Figure 7B:
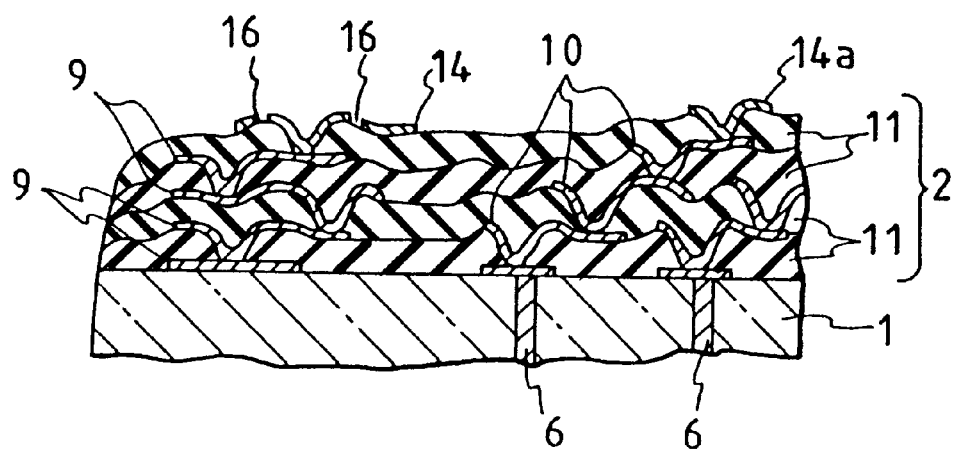
Figure 8:
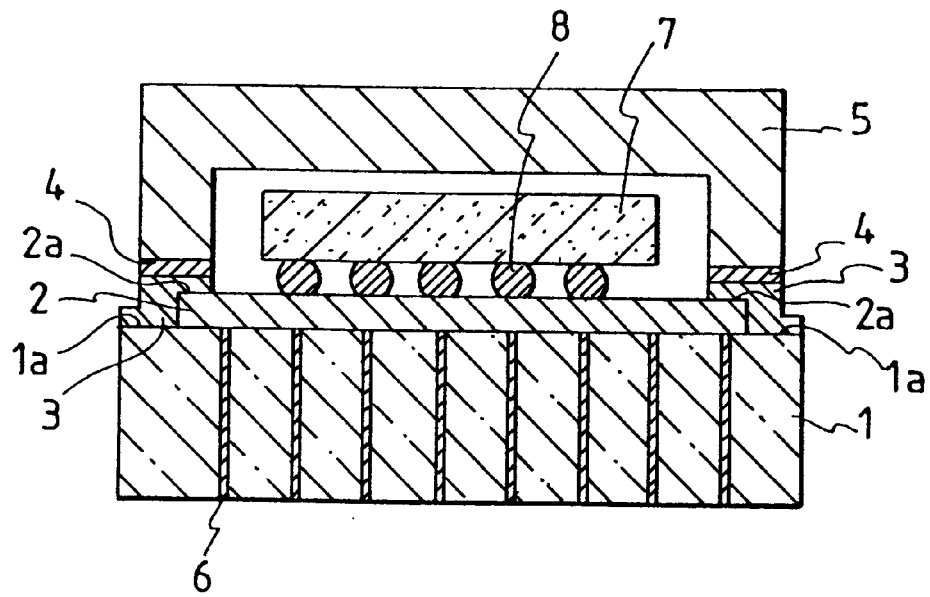
FIG. 8 is a sectional view of a conventional multilayer wiring board.

In this embodiment the shield structure for the multilayer wiring board is formed substantially in the same manner as in the embodiment illustrated in FIGS. 2A–2F' except that gas vent holes 16 are formed upon the formation of the joining metal layer 14. FIGS. 7A–7B are views for explaining the wiring layer formed by this embodiment. FIG. 7A is a plan view of the wiring layer, and FIG. 7B is a sectional view taken along the line AA' of FIG. 7A.

The metal layer pattern 14 for brazing provided at the uppermost layer often has a width of about 1 to 5 mm for securing the certain joining. In the case that the metal pattern with such a wide width is formed on the organic insulating layer, water stored in the organic insulating layer directly under the pattern is vaporized and expanded by heating upon joining, so that the metal layer tends to be peeled from the surface of the insulating layer due to the pressure generated at that time. In particular, the polyimide layer 11 at the uppermost layer being in contact with the atmosphere stores the water in an amount more than that at the other layer and it mostly receives the heat due to the joining. Accordingly, the joining metal pattern 14 formed at the uppermost layer tends to be peeled upon the joining.

In this embodiment the gas vent holes 16 are formed on the joining metal layer pattern at the uppermost layer for degassing therethrough, thereby making it possible to prevent the peeling due to the heating upon joining. In addition, in place of the gas vent holes 16, grooves may be formed. Moreover, the gas vent holes 16 may be formed on the frame pattern 9 in addition to the joining metal layer 14. In either case, the gas vent holes 16 or the grooves must be formed so as not to obstruct the continuity of the shield structure.

In addition, the gas vent holes 16 may be formed on the metal layer pattern 14 for joining the cap in the multilayer wiring board fabricated by the fabrication method described in FIGS. 11A–11F, with the same effect.

Figure 10A:
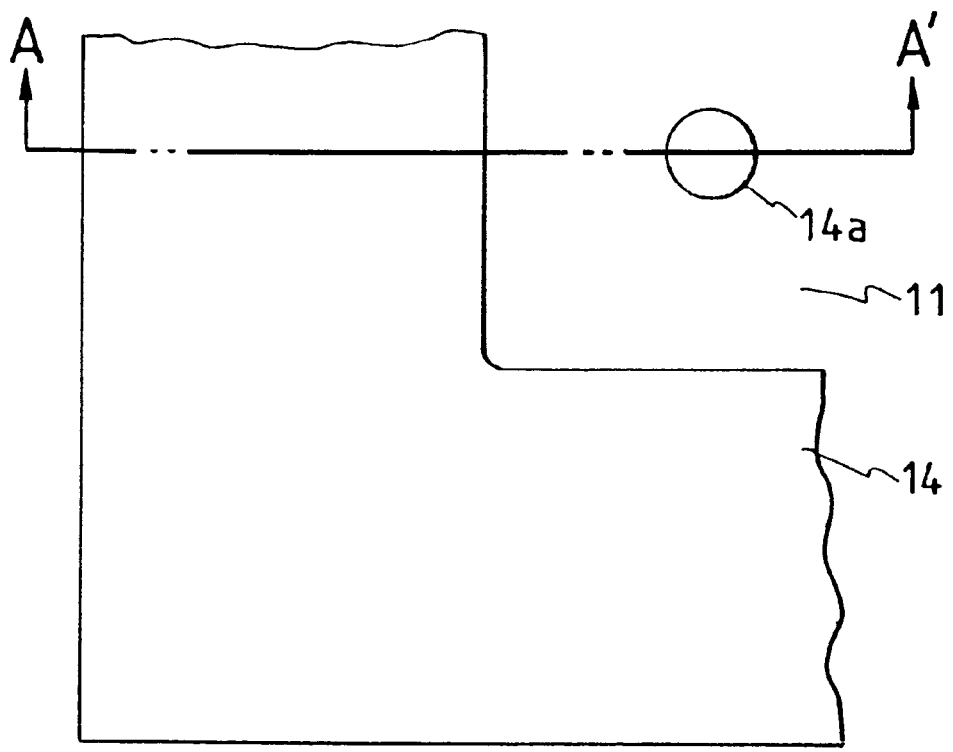
FIGS. 10A–B are plan and sectional views of a multilayer wiring board in which a shield structure is formed of only the joining metal layer.
Figure 10B:
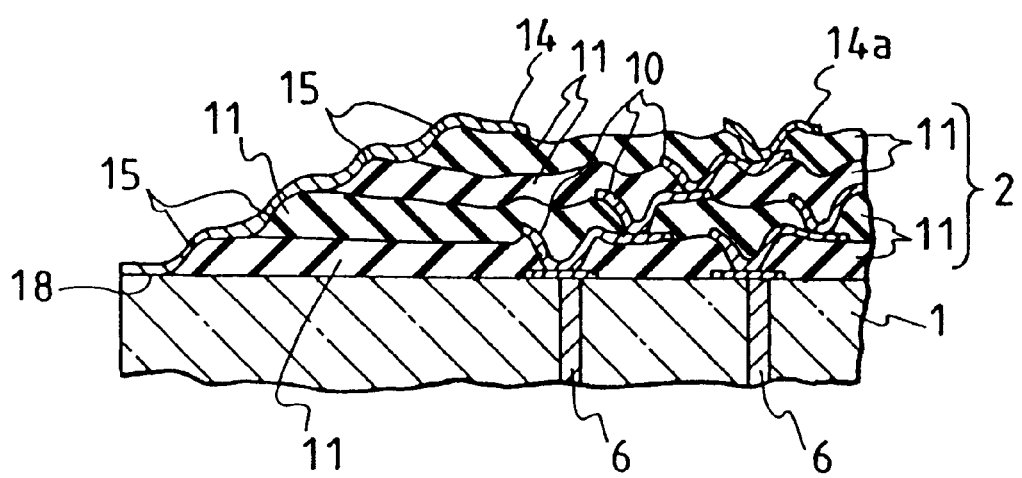

In another embodiment, the shield structure of a multi-layer wiring board is formed of only a joining metal layer 14 at the uppermost layer. FIGS. 10A–10B are views for explaining a wiring layer formed in this embodiment. FIG. 10A is a plan view of the wiring layer and FIG. 10B is a sectional view taken along the line AA" of FIG. 10A. According to the fabrication method of this embodiment based on the embodiment illustrated in FIGS. 2A–2F', in the steps illustrated in FIG. 2A and 2A' as well as 2C and 2C', the frame pattern 9 is not formed in the step illustrated in FIG. 2B–2B'. Also the groove 13 is not formed and an insulating layer is formed while leaving a portion (outer peripheral portion) 18 of the board. In the step illustrated in FIGS. 2E–2E' the metal layer for connecting the wirings is formed and the frame joining metal layer is formed so as to cover the outer peripheral portion 18 of the board and the side surface 15 of the polyimide layer 11. FIG. 10A is a plan view of the wiring layer and FIG. 10B is a sectional view taken along the line AA' of (a).

Figure 13A:
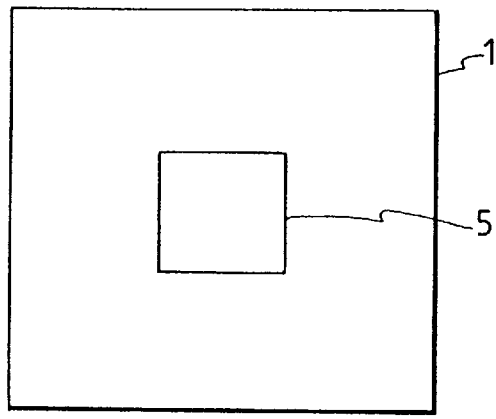
FIGS. 13A–B are plan views of a multilayer wiring board in which a shield structure is formed on part of the board.
Figure 13B:
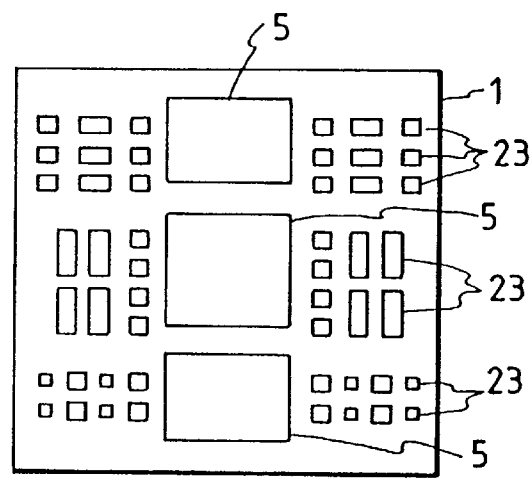

In the embodiments illustrated in FIGS. 2A–2F' and 11A–11F the walls made of a metal formed in the insulating layer may be formed so as to surround only one portion of the board as shown in FIG. 13A depending on the arrangement of the wiring pattern. Moreover, as shown in FIG. 13B, the walls of the metal may be formed so as to surround a plurality of portions of the board. In this way, only the necessary portions may be sealed air-tight, and discrete parts 23 such as chip resistance and capacitor and LSI chips 7 sealed air-tight by caps 5 can be mixedly mounted on the board.

Figure 14A:
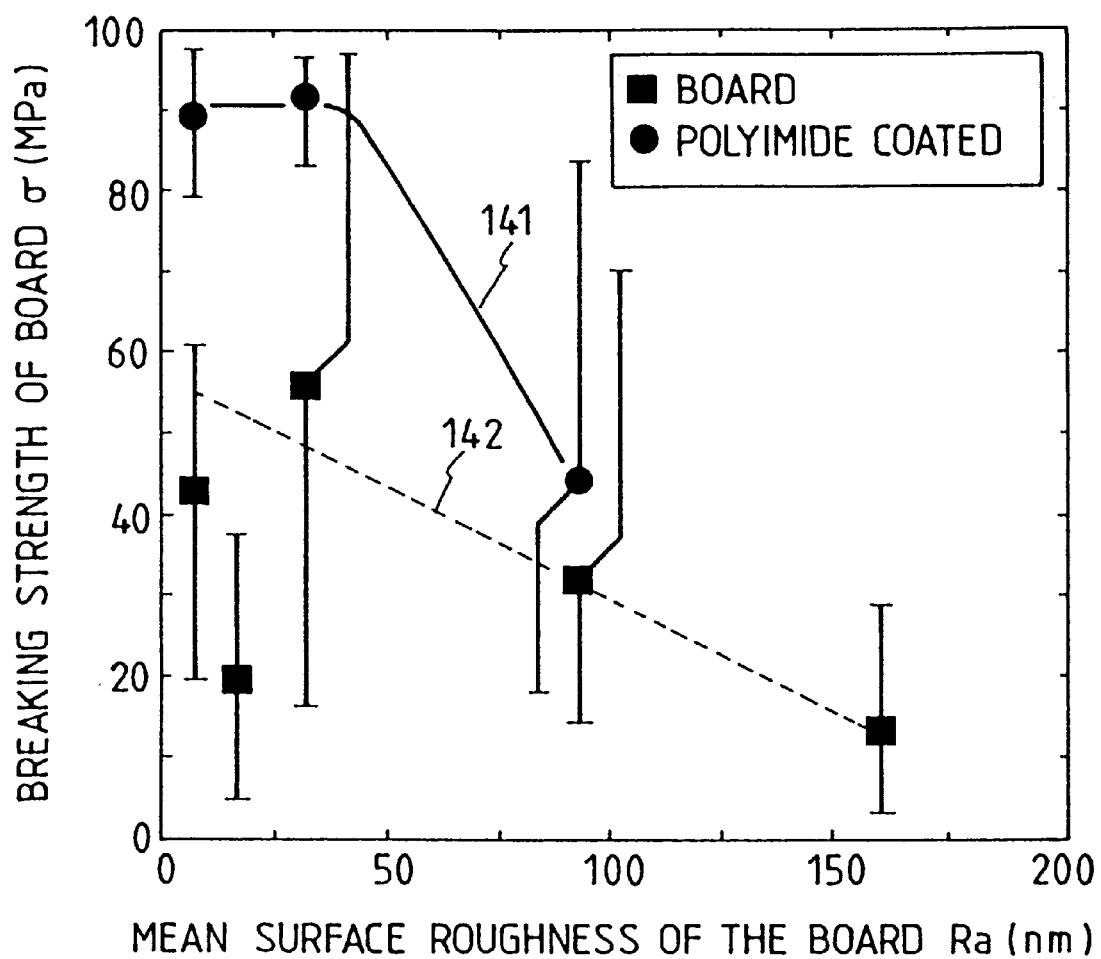
FIGS. 14A–D are a graph showing the results of a breaking strength test for the surface of a board and schematic diagrams illustrating how the tests are conducted.
Figure 14B:
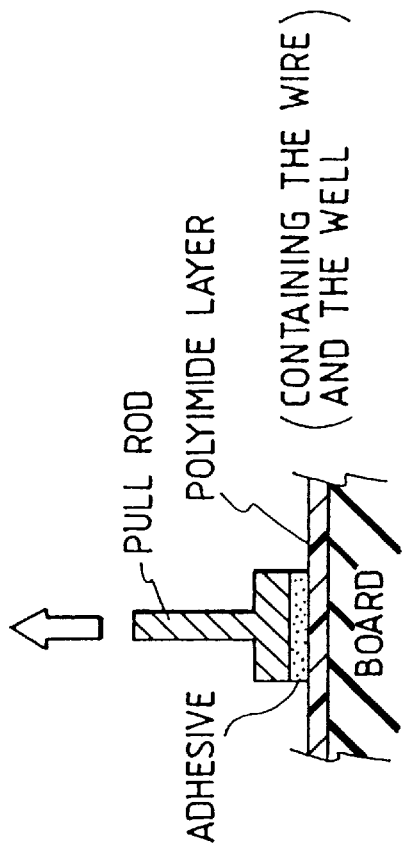
Figure 14C:
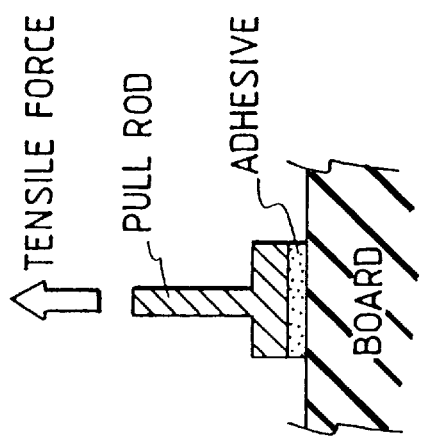
Figure 14D:
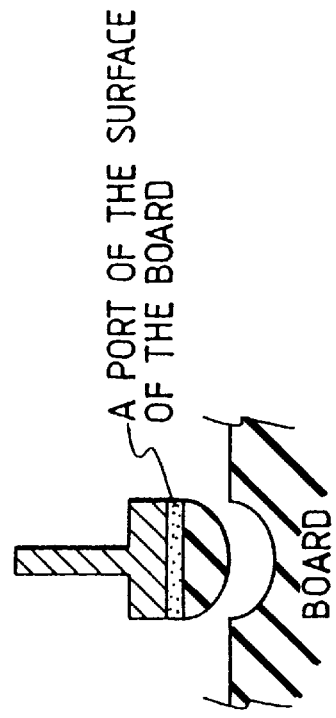

The breaking strength of a ceramic board is measured under the condition that a force is applied to a pull rod attached to the board as illustrated in FIGS. 14B and 14D. Similarly, the breaking strength of a ceramic board on which a polyimide insulating layer is formed to a thickness of 8 $\mu$m is measured under the condition that a force is applied to a pull rod attached to a polyimide insulating layer on the board as illustrated in FIG. 14C. The results are shown in FIG. 14A. In this figure the surface roughness of the board is taken as a parameter. Within the range of the surface roughness obtained by the experiments the breaking strength in a case 141 where the polyimide insulating layer is formed on the board (FIG. 14C) is larger, occasionally twice or more, than that in a case 142 where the polyimide insulating layer is not formed on the board (FIGS. 14B and 14D). As a result, it is advantageous that the joining pattern to which a large stress is applied due to the change in temperature or the like upon brazing for sealing a cap or in use of the wiring board is formed on the polyimide insulating layer compared with the case where it is formed directly on the board in terms of reliability and fabricating yield.

According to the above-described embodiments, there can be provided a wiring board having a shield structure capable of preventing the permeation of water and gas into the interior of the board without addition of any process in formation of the multiple wiring layers. In particular, for a high density mounting board having multiple thin film wiring layers on a ceramic board, the effect is large, that is, a pad for fixing a cap is not required to be formed because an LSI chip sealing cap can be directly fixed on the surface of an organic insulating layer at the uppermost surface of the thin film wiring layers. Moreover, since the cap is fixed on the relatively soft organic matter, it is possible to absorb a thermal stress generated between the cap and the board due to a thermal cycle upon brazing by the elastic/plastic deformation of the surfaces of the insulating layers, and hence to prevent the brittle ceramic from being directly applied with a large stress. Accordingly, the surface of the board can be prevented from being broken and cracked, which makes it possible to enhance the reliability of the sealing. The wiring boards in these embodiments are suitable for high density mounting boards used for computers and exchangers.

Moreover, in the fabrication process for the wiring board, at the same time when the wiring pattern for each wiring layer is formed, or after the wiring pattern is formed, the wirings are connected to each other. Thus, along with the filling of the though-holes, the shield wall for maintaining air-tightness is formed in the insulating layer or at the end portions of the insulating layer, which eliminates the necessity for adding a new process for air-tightly sealing the wiring layer. Accordingly, as compared with the conventional manner, it is possible to greatly reduce the number of fabrication steps and to prevent the generation of new failures in a difficult process to form the sealing portion and hence to enhance the yield.

Even in the case using a board such as brittle ceramic or glass, since a thermal stress upon joining is relaxed by the organic insulating layers and is thus prevented from transmitting to the board, it is possible to prevent the breakage and the cracking on the surface of the board due to the stress generated upon joining. Therefore, it is possible to extremely enhance the fabricating yield and the reliability of the wiring board.

Moreover, since the region required for formation of the shield wall is made small and is contained under the metal pattern for brazing, the effective mounting density of the wiring board can be enhanced. Additionally, the wiring pattern is formed in the vicinity of the shield wall and in this regard it is possible to enhance the effective mounting density.

According to the present invention, there is provided a method for fabricating a multilayer wiring board which is capable of preventing the generation of fixing failure due to an organic residue, eliminating an increase in the number of processes and reducing an area required for bonding the cap and a multilayer wiring board fabricated by the above fabrication method.

There has been described a new and useful multilayer wiring board and method of fabricating the same. It should be appreciated that modifications and additions will be apparent to those of ordinary skill in the art in applying the teachings of the invention described herein to various applications. Accordingly, the invention should not be limited by the description herein of the preferred embodiments but rather the invention should be construed in accordance with the following claims.

We claim:

1. A multilayer wiring board for interconnecting terminals of an electronic device, comprising:

a thick film wiring board having a wiring pattern;

a thin film wiring board formed on said thick film wiring board and having a plurality of insulating layers disposed one on top of another, each of said insulating layers is made of an organic matter;

each of said insulating layers has a wiring pattern located on an inner portion of said each insulating layer and a frame pattern located on a peripheral portion of said wiring pattern, said frame pattern surrounds said wiring pattern;

wherein first wiring and frame patterns located on a first insulating layer of said insulating layers are interconnected to said wiring pattern of said thick film wiring board;

wherein each succeeding insulating layer disposed on top of a previous insulating layer of said insulating layers has located thereon a succeeding wiring pattern interconnected to a previous wiring pattern located on said previous insulating layer of said insulating layers by a through hole and a succeeding frame pattern interconnected to a previous frame pattern located on said previous insulating layer of said insulating layers by a continuous channel formed in said previous insulating layer of said insulating layers;

wherein a last wiring pattern located on a last one of said insulating layers is adapted for connection to said terminals of said electronic device; and a cap attached to a last frame pattern located on said last insulating layer of said insulating layers, wherein said continuous channel is filled with an inorganic matter;

wherein said frame patterns are continuously interconnected to each other through said inorganic matter filled in said continuous channels;

wherein said inorganic matter comprises a conductor which forms a shield structure which prevents permeation of water or gas into said thin film wiring board; and wherein at least one layer of said frame pattern included in said shield structure has gas-vent holes.

2. A method of fabricating a multilayer wiring board interconnecting terminals of an electronic device, comprising the steps of:

(a) forming a wiring pattern and frame pattern on a thick film wiring board having a thick film wiring pattern, said wiring pattern and said frame pattern formed on said thick film wiring board being connected to said thick film wiring pattern, and said frame pattern formed on said thick film wiring board surrounds said wiring pattern formed on said thick film wiring board;

(b) forming an insulating layer made of an organic matter on said formed wiring pattern and said frame pattern;

(c) forming through-holes in said insulating layer over said formed wiring pattern and a continuous channel in said insulating layer over said formed frame pattern by removing portions of said insulating layer;

(d) forming another wiring pattern and frame pattern on said insulating layer around said through-holes and said continuous channel to connect said another wiring pattern and frame pattern to said formed wiring pattern and frame pattern;

(e) repeating steps (b) through (d) a specified number of times to form a thin film wiring board on said thick film wiring board;

(f) connecting said terminals of said electronic device to an uppermost wiring pattern of said thin film wiring board; and (g) connecting a cap to an uppermost frame pattern of said thin film wiring board, wherein at least one layer of said frame patterns has gas vent holes.

3. A multilayer wiring board comprising:

at least one wiring layer made of a conductor;

at least one insulating layer made of an organic matter; and a board;

wherein said at least one wiring layer and said insulating layer are alternately laminated on said board, wherein a cap is provided for covering said insulating layer and said at least one wiring layer;

wherein said at least one wiring layer has a wiring pattern for forming a wiring, and a frame pattern for surrounding said wiring pattern;

wherein said insulating layer has a shield structure made of inorganic matter around the outer peripheral portion thereof;

wherein said shield structure being formed of said frame pattern, said frame pattern being continuously interconnected to said frame pattern of said at least one wiring pattern;

wherein said cap is joined to an uppermost layer of said shield structure; and wherein at least one layer within said frame pattern constituting said shield structure has gas-vent holes.

4. A fabrication method for a multilayer wiring board comprising:

a first wiring layer formation step of forming a wiring layer made of a conductor on a board;

an insulating layer formation step of forming an insulating layer made of an organic matter on said wiring layer;

a through-hole formation process step of a through-hole, which will connect said wiring layer formed by said first wiring layer formation step to a wiring layer formed on the upper surface of said insulating layer formed by said insulating layer formation step, on said insulating layer;

a second wiring layer formation step of forming said wiring layer formed on the upper surface of said insulating layer;

a step of repeating said insulating layer formation and said second wiring layer formation steps by a specified number, wherein a frame-like pattern for surrounding said wiring pattern is further formed in said first wiring layer formation step and an upper frame-like pattern is formed in said second wiring layer formation step;

wherein said upper frame-like pattern is connected to said frame-like pattern in said second wiring layer formation step; and a cap joining step of joining a cap having a function to shield an uppermost wiring layer formed on the upper surface of said insulating layer and said insulating layer from the atmosphere, said frame-like pattern of said uppermost wiring layer formed by said second wiring layer formation process, wherein at least one layer within said frame-like pattern constituting said shield structure has gas vent holes.

* * * * *